United States Patent
Hsu et al.

(10) Patent No.: US 6,846,618 B2
(45) Date of Patent: Jan. 25, 2005

(54) PROCESS FOR IMPROVING CRITICAL DIMENSION UNIFORMITY

(75) Inventors: Yi-Yu Hsu, Taipei (TW); Kuo-Chen Wang, Chiai (TW); Yao-Ting Shao, Sanchung (TW)

(73) Assignee: Winbond Electronics Corporation, Hsinchu (TW)

(*) Notice: Subject to any disclaimer, the term of this patent is extended or adjusted under 35 U.S.C. 154(b) by 156 days.

(21) Appl. No.: 10/215,295

(22) Filed: Aug. 8, 2002

(65) Prior Publication Data

US 2003/0044722 A1 Mar. 6, 2003

(30) Foreign Application Priority Data

Aug. 28, 2001 (TW) .................................. 90121170 A (51) Int. Cl.[7] .................................................. G03F 7/26
(52) U.S. Cl. ...................................... 430/316; 430/394
(58) Field of Search ................................. 430/311, 313, 430/316, 329, 394

(56) References Cited

U.S. PATENT DOCUMENTS 5,691,223 A * 11/1997 Pittikoun et al. ........... 438/253
2003/0036005 A1 * 2/2003 Griesinger ..................... 430/5

* cited by examiner

Primary Examiner—Kathleen Duda
(74) Attorney, Agent, or Firm—Birch, Stewart, Kolasch & Birch, LLP (57) ABSTRACT

The present invention uses a double exposure and double etching method to improve critical dimension uniformity. A coating layer is formed on a wafer that includes a first area and a second area. The first area and the second area are separately patterned with different processing conditions. By means of this two-stage patterning, the CD uniformity between wafer center and wafer edge is successfully improved over the conventional single-stage patterning process. The fabrication yield is thus enhanced.

9 Claims, 8 Drawing Sheets

PROCESS FOR IMPROVING CRITICAL DIMENSION UNIFORMITY

Pursuant to 35 U.S.C. § 119(a)–(d), this application claims priority from Taiwanese application Ser. No. 90121170, filed on Aug. 28, 2001.

BACKGROUND OF THE INVENTION

1. Field of the Invention

The present invention relates to a process for fabricating a semiconductor device, and more particularly to a process for improving critical dimension uniformity by means of a double exposure and double etching method.

2. Description of the Prior Art

In semiconductor fabrication, lithography is accomplished by subjecting a wafer to step-by-step (or scan-by-scan) exposure. Before exposure, lithography parameters, such as photo-resist coating thickness, baking/cooling temperature and time, developing mechanism and time, exposure dose, best focus offset and numerical aperture (NA), are fine-tuned and optimized. Next, etching is conducted to transfer the photoresist pattern to the underlying layer. The same, before etching, etching parameters, such as gas ratio, flow rate, bias pressure power, temperature, etching selectivity, and etching mode, must be tuned. By means of fine-tuning lithography and etching parameters, the desired critical dimension (CD) can thus be achieved.

However, when after-etching-inspection (AEI) is performed, it is always found that there exists CD bias between wafer center and wafer edge, which results in some fatal failures such as contact hole "open" in wafer acceptance test (WAT). This severely affects yield. Multi-layered films involve more sophisticated and complicate coating and etching steps than conventional single layer film. Therefore, the multi-layered film suffers from a more severe CD bias between wafer center and wafer edge after etching.

Figure 1:
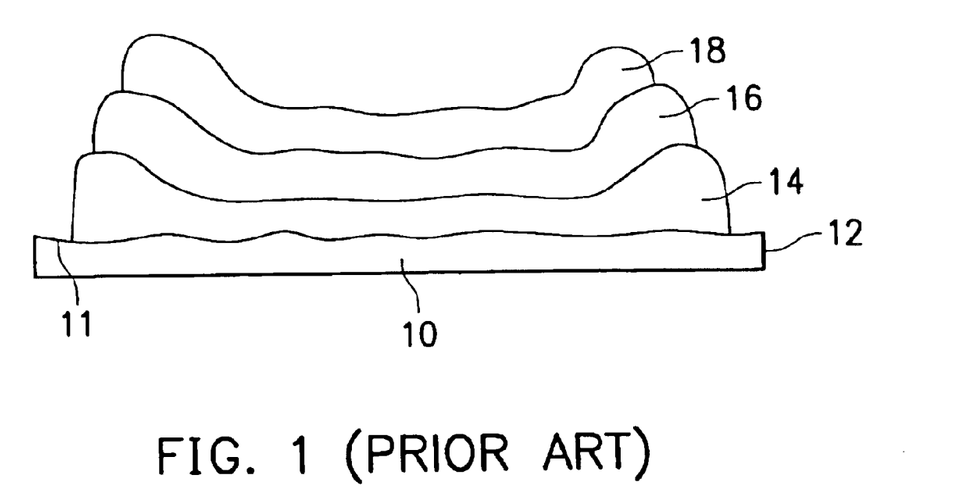
FIG. 1 is a cross-section showing multiple layersed coating layer, formed by spin-coating, on a wafer.

CD bias between wafer center and wafer edge mainly results from the following three factors. First of all, multi-layered film formed by spin-on-coating causes inferior uniformity. Referring to FIG. 1, the multi-layered film coated on a semiconductor substrate 12 includes an anti-reflection layer 14, a spin-on glass (SOG) layer 16, and a photoresist layer 18. The topography of the center part 10 and edge part 11 in the multi-layered film is not uniform. The center part 10 is thinner and the edge part 11 is thicker. Second, etching is not uniform for wafer center and wafer edge. Third, the uneven substrate 12 (see FIG. 1) can even cause CD bias.

In the lithography stage, the CD bias between wafer center and wafer edge can be somewhat suppressed by changing parameters of the exposure tool, for example, by changing the ratio of exposure dosage to exposure area. However, in the etching stage, the etch bias still results in CD bias between wafer center and wafer edge, which eventually causes device failure.

SUMMARY OF THE INVENTION

An object of the present invention is to solve the critical dimension (CD) bias problem between wafer center and wafer edge in order to enhance the semiconductor yield.

Another object of the present invention is to improve CD uniformity in integrated circuits.

A further object of the present invention is to provide a process for improving CD uniformity, such that after lithography and etching processing, a desired CD can be obtained at both the wafer's center and edge.

To achieve the above objects, the present invention uses a double exposure and double etching method to improve critical dimension uniformity.

According to a first preferred embodiment of the present invention, the process for improving critical dimension uniformity suitable for use in integrated circuits includes the following steps. A coating layer is formed on a wafer that includes a first area and a second area. The first area and the second area in the coating layer are separately patterned, and the two areas are patterned with different processing conditions.

According to another preferred embodiment of the present invention, the process for improving critical dimension uniformity suitable for use in integrated circuits includes the following steps. A coating layer is formed on a wafer including a first area and a second area. A first photoresist layer is formed on the coating layer. The first photoresist layer in the first area is subjected to lithography process according to a pattern with a first lithography parameter. The coating layer in the first area is etched with a first etching parameter. The first photoresist layer is removed. A second photoresist layer is formed on the coating layer. The second photoresist layer in the second area is subjected to lithography process according to the pattern with a second lithography parameter. The second photoresist layer in the second area is etched with a second etching parameter.

In the present invention, wafer center and wafer edge are separately patterned with different processing conditions. By means of this two-stage patterning, the CD uniformity between wafer center and wafer edge is successfully improved over the conventional single-stage patterning process, which patterns the entire wafer with the same processing condition. The fabrication yield is thus enhanced.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENTS

Figure 2A:
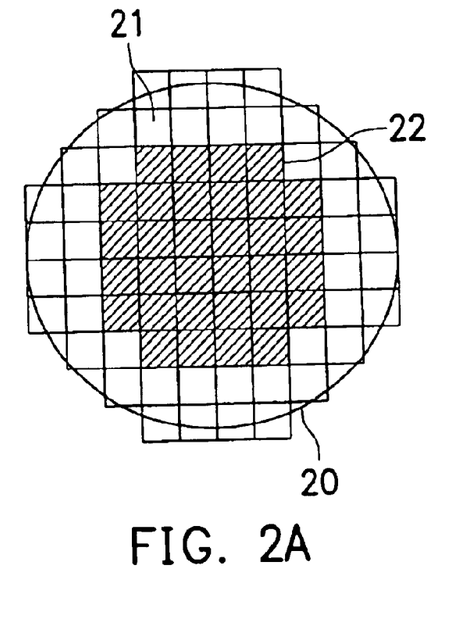
FIG. 2A is a schematic diagram showing the first area defined in the embodiment of the present invention.
Figure 2B:
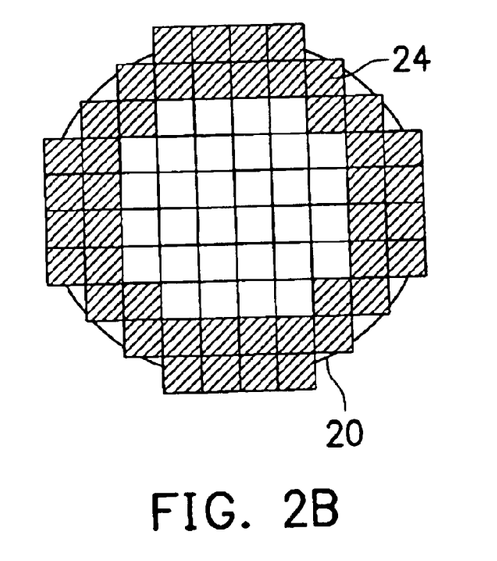
FIG. 2B is a schematic diagram showing the second area defined in the embodiment of the present invention.
Figure 3:
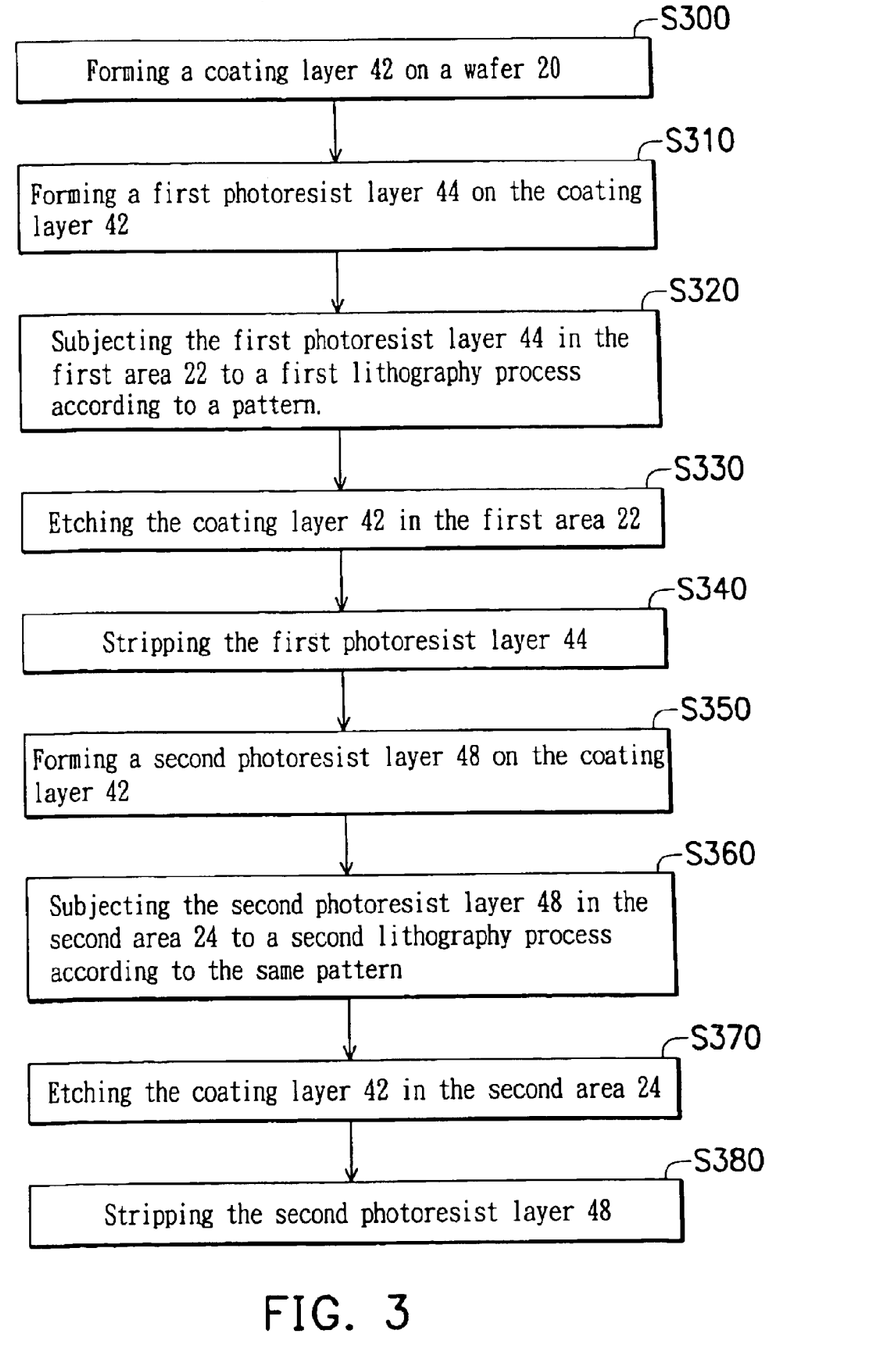
FIG. 3 is the flow chart of the embodiment of the present invention.
Figure 4A:
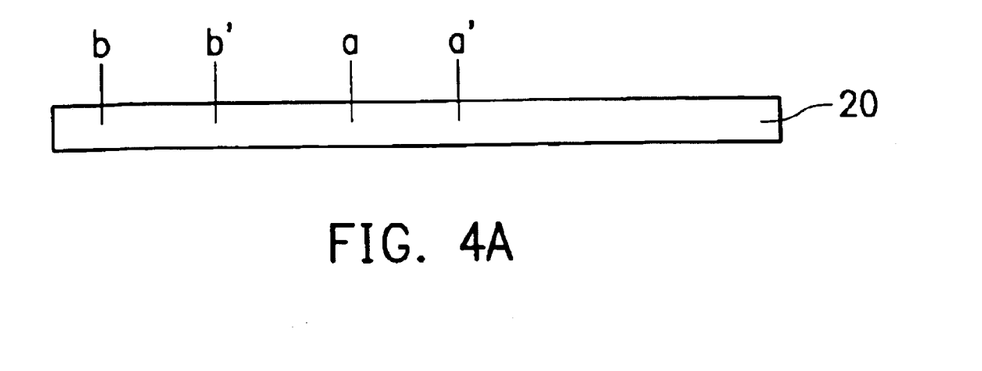
FIG. 4A is a cross-section showing the first area aa' and second area bb' of a wafer according to the embodiment of the present invention.

FIGS. 2A and 2B are schematic diagrams showing the first area 22 and the second area 24 defined in the embodiment of the present invention. The first area 22 and second area 24 should preferably not overlap. The region 21 is the exposure field for one time exposure in step-by-step or scan-by-scan exposure processing. Referring to FIG. 3 together with FIGS. 4B to 4J, in which FIG. 3 is the flow chart of the embodiment of the present invention and FIGS. 4B to 4J are cross-sections of the wafer corresponding to steps S300 to S380 of FIG. 3. FIG. 4A is a cross-section showing the first area aa' and second area bb' of a wafer according to the embodiment of the present invention.

Figure 4B:
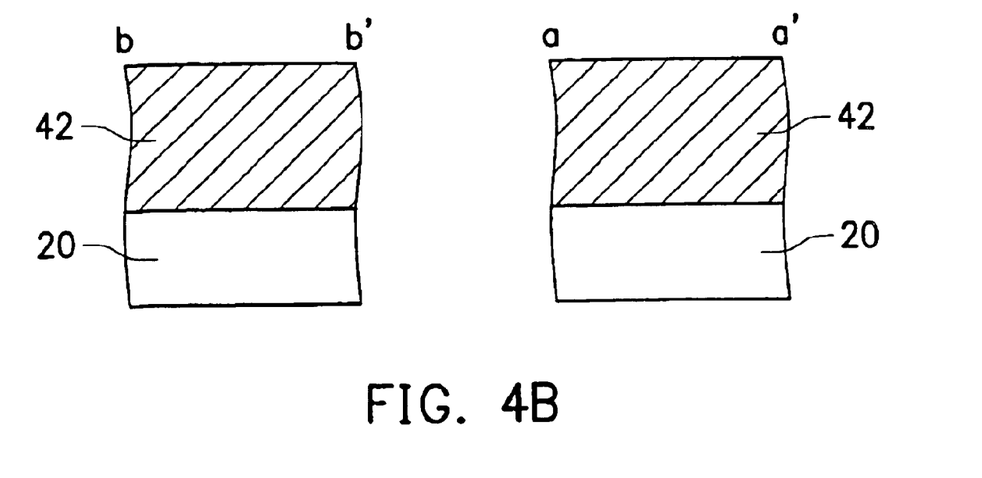
FIGS. 4B to 4J are cross-sections of the wafer corresponding to steps S300 to S380 of FIG. 3.

First, as in step S300 and FIG. 4B, a coating layer 42 is formed on a wafer 20.

Figure 4C:
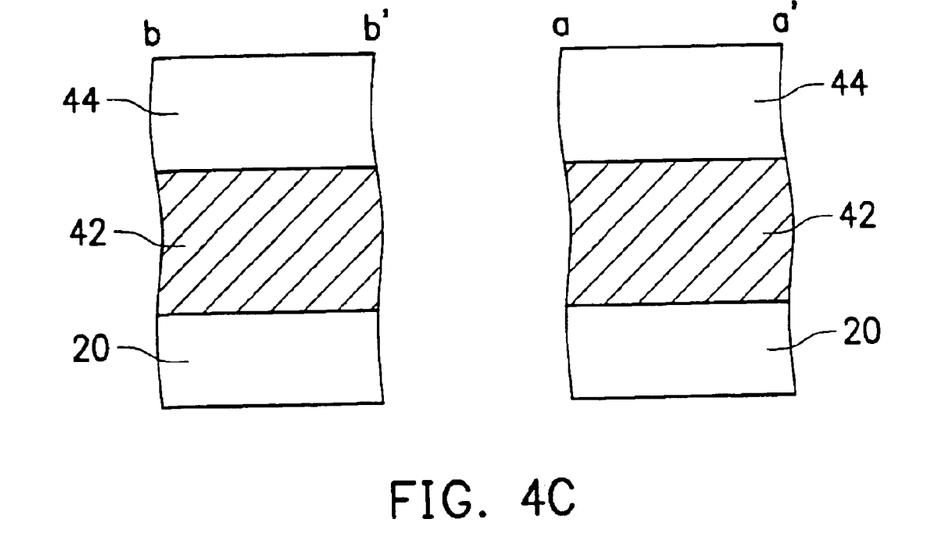

Then, as in step S310 and FIG. 4C, a first photoresist layer 44 is formed on the coating layer 42.

Figure 4D:
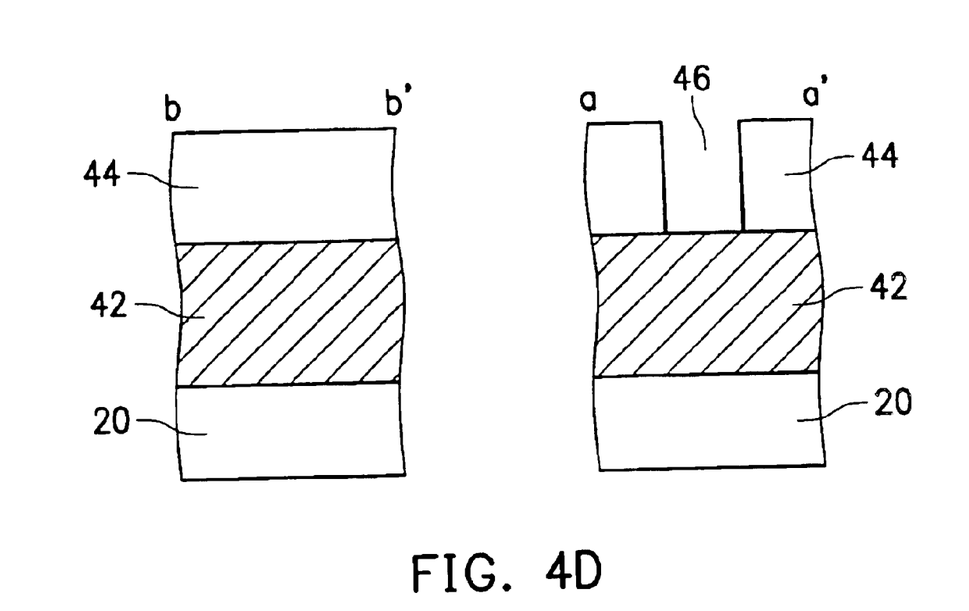

Subsequently, as in step S320 and FIG. 4D, the first photoresist layer 44 in the first area 22 is subjected to a first lithography process according to a pattern. The lithography parameters of the first lithography process are set according to the properties of the first area 22 and its desired CD goal. The first lithography process includes the following steps. The first photoresist layer 44 in the first area 22 is exposed to radiation through a mask, and then developed. Thus, the pattern of the mask is transferred to the first photoresist layer 44 in the first area 22 to form a pattern 46.

Figure 4E:
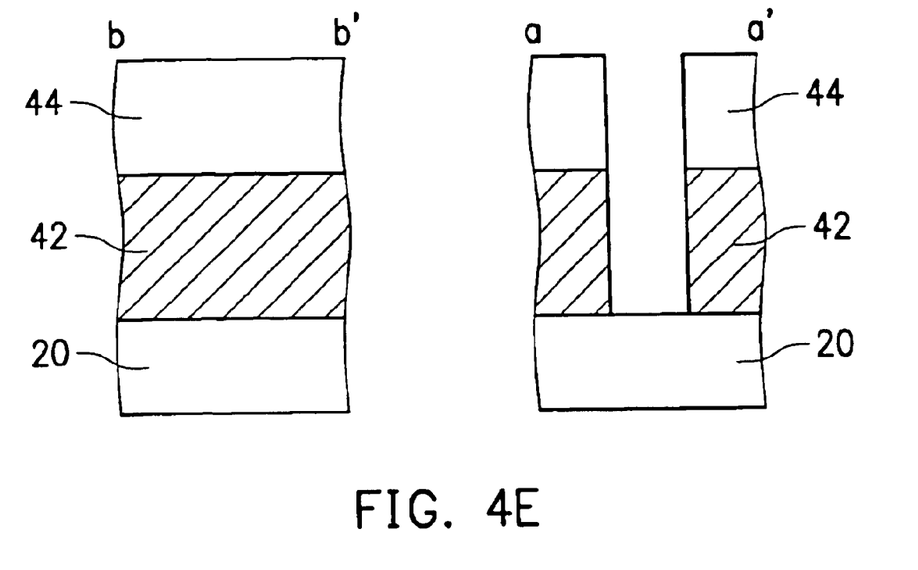

Subsequently, as in step S330 and FIG. 4E, the coating layer 42 is etched with first etching parameters according to the properties of the first area 22 and its desired CD goal.

Figure 4F:
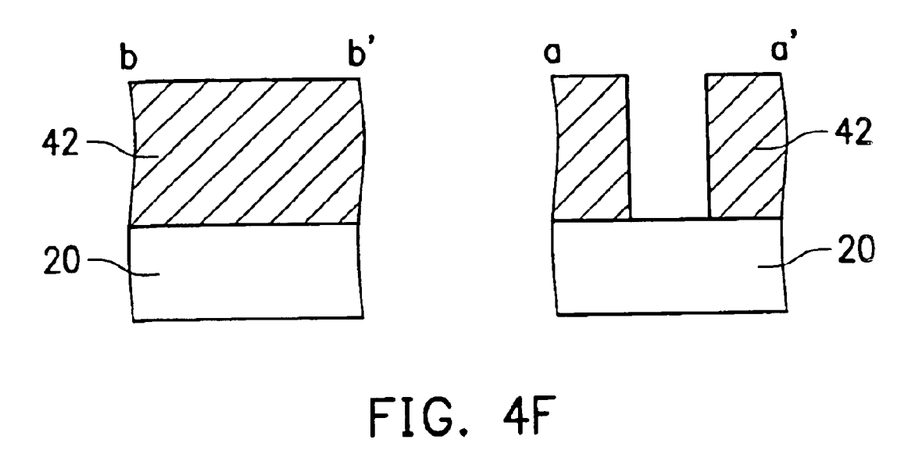

Subsequently, as in step S340 and FIG. 4F, the first photoresist layer 44 is stripped.

Figure 4G:
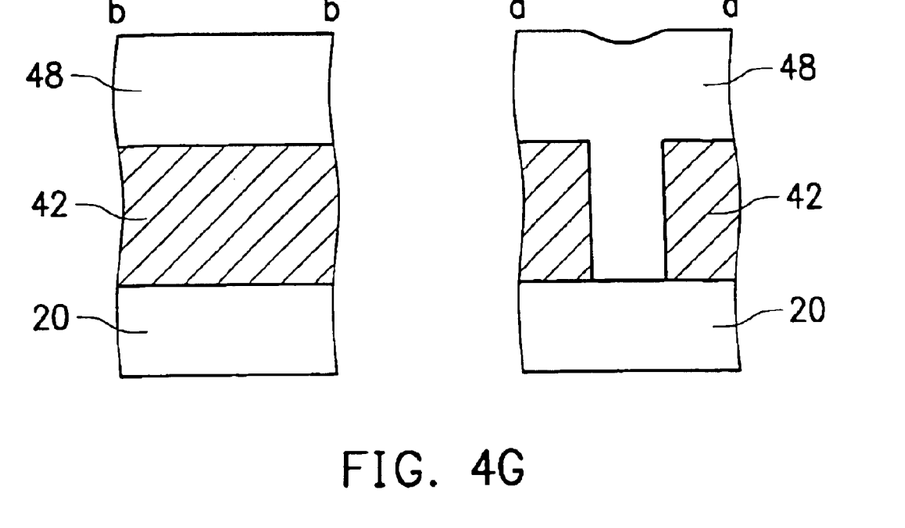

Subsequently, as in step S350 and FIG. 4G, a second photoresist layer 48 is formed on the coating layer 42.

Figure 4H:
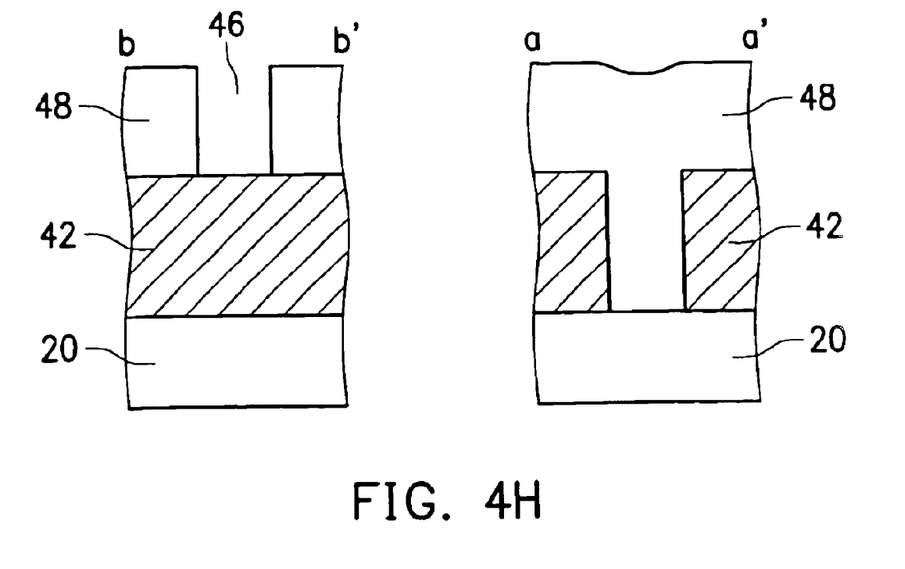

Subsequently, as in step S360 and FIG. 4H, the second photoresist layer 48 in the second area 24 is subjected to a second lithography process according to the same pattern as that used in the first lithography process. The lithography parameters of the second lithography process are set according to the properties of the second area 24 and its desired CD goal. The second lithography parameters applied to the second area are different from the first lithography parameters applied to the first area. The second lithography process includes the following steps. The second photoresist layer 48 in the second area 24 is exposed to radiation through a mask the same as that used in the first lithography process, and then developed. Thus, the pattern of the mask is transferred to the second photoresist layer 48 in the second area 24 to form a pattern 46.

Figure 4I:
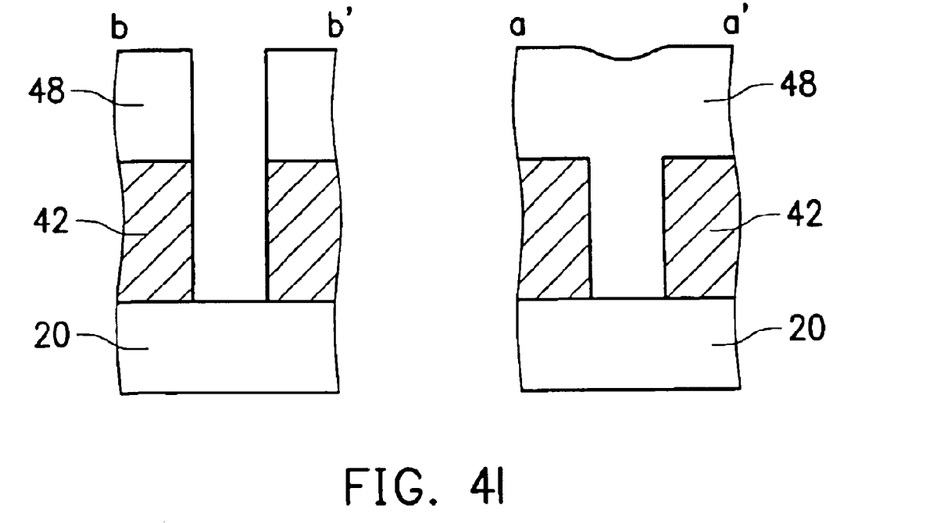

Subsequently, as in step S370 and FIG. 4I, the coating layer 42 is etched with second etching parameters according to the properties of the second area 24 and its desired CD goal. The second etching parameters applied to the second area 24 are different from the first etching parameters applied to the first area 22.

Figure 4J:
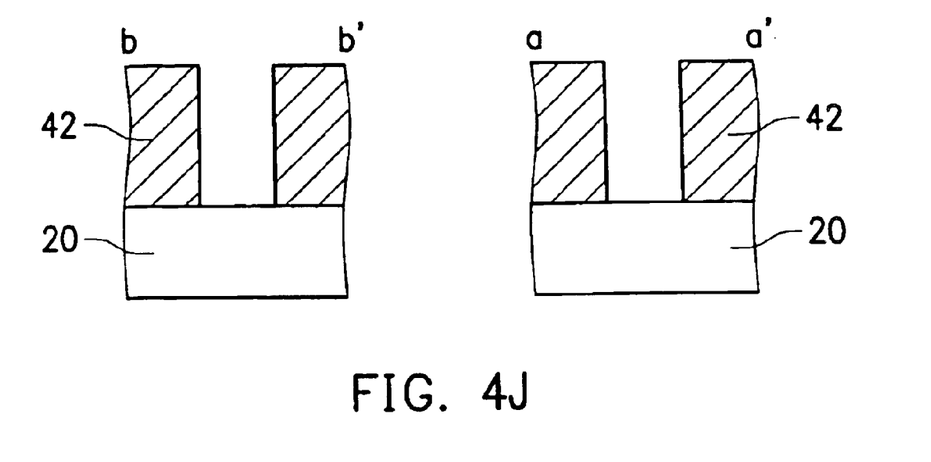

Finally, as in step S380 and FIG. 4J, the second photoresist layer 48 is stripped.

The above-mentioned first area 22 is preferably a center area of the wafer, and the second area 24 is preferably an edge area of the wafer, surrounding the center area. The coating layer can be a single layer formed by spin-coating or multiple layers formed by spin-coating.

In conclusion, the present invention uses a double exposure and double etching method. That is to say, wafer center and wafer edge are separately patterned with different processing conditions. By means of this two-stage patterning, the CD uniformity between wafer center and wafer edge is successfully improved over the conventional single-stage patterning process, which patterns the entire wafer with the same processing condition. The fabrication yield is thus enhanced.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for improving critical dimension uniformity suitable for use in integrated circuits, comprising:

forming a coating layer on a wafer, the wafer including a first area and a second area;

forming a first photoresist layer on the coating layer;

subjecting the first photoresist layer in the first area to lithography process according to a pattern with a first lithography parameter;

etching the coating layer in the first area with a first etching parameter;

removing the first photoresist layer;

forming a second photoresist layer on the coating layer;

subjecting the second photoresist layer in the second area to lithography process according to the pattern with a second lithography parameter; and etching the coating layer in the second area with a second etching parameter.

2. The process as claimed in the claim 1, wherein first lithography parameter applied to the first area is different from the second lithography parameter applied to the second area.

3. The process as claimed in claim 2, wherein the first etching parameter applied to the first area is different from the second etching parameter applied to the second area.

4. The process as claimed in claim 2, wherein the step of subjecting the first photoresist layer in the first area to lithography process with a first lithography parameter includes subjecting the first photoresist layer in the first area to exposure and developing.

5. The process as claimed in claim 2, wherein the step of subjecting the second photoresist layer in the second area to lithography process with a second lithography parameter includes subjecting the second photoresist layer in the second area to exposure and developing.

6. The process as claimed in claim 5, wherein the first area is a center area of the wafer, and the second area is an edge area of the wafer.

7. The process as claimed in claim 6, wherein the center area and the edge area do not overlap.

8. The process as claimed in claim 1, wherein the coating layer is a single layer formed by spin-coating.

9. The process as claimed in claim 1, wherein the coating layer is multiple layers formed by spin-coating.

* * * * *